United States Patent
Lin et al.

(10) Patent No.: US 9,901,015 B2
(45) Date of Patent: Feb. 20, 2018

(54) DISPLAY DEVICE

(71) Applicants: Qisda (Suzhou) Co., Ltd., Suzhou, Jiangsu (CN); Qisda Corporation, Taoyuan (TW)

(72) Inventors: Teh-Cheng Lin, Keelung (TW); Yung-Yeh Chang, Taoyuan (TW)

(73) Assignees: Qisda (Suzhou) Co., Ltd., Suzhou (CN); Qisda Corporation, Taoyuan (TW)

( * ) Notice: Subject to any disclaimer, the term of this patent is extended or adjusted under 35 U.S.C. 154(b) by 75 days.

(21) Appl. No.: 15/080,522

(22) Filed: Mar. 24, 2016

(65) Prior Publication Data

US 2016/0286696 A1 Sep. 29, 2016

(30) Foreign Application Priority Data

Mar. 27, 2015 (TW) .............................. 104110089 A

(51) Int. Cl.
*H05K 7/20* (2006.01)

(52) U.S. Cl.
CPC ..... *H05K 7/20972* (2013.01); *H05K 7/20136* (2013.01); *H05K 7/20209* (2013.01)

(58) Field of Classification Search
CPC .............. H05K 7/20972; H01L 51/524; H01L 51/5253; H01L 51/525; H01L 51/5246
See application file for complete search history.

(56) References Cited

U.S. PATENT DOCUMENTS

| 5,428,964 A * | 7/1995 | Lobdell ................ F24F 11/0009 236/44 C |
| 5,991,153 A * | 11/1999 | Heady .................... H05K 7/202 165/185 |
| 7,697,275 B2 * | 4/2010 | Chen ................. G02F 1/133308 349/58 |
| 8,081,267 B2 * | 12/2011 | Moscovitch .......... G06F 1/1601 349/56 |
| 8,411,227 B2 * | 4/2013 | Kim .................. G02F 1/133385 349/161 |

(Continued)

FOREIGN PATENT DOCUMENTS

| CN | 101783482 | 7/2010 |
| CN | 104200758 | 12/2014 |

(Continued)

*Primary Examiner* — Robert J Hoffberg
*Assistant Examiner* — Matt Dhillon

(57) ABSTRACT

A display device includes a casing, a display panel, a transparent plate, a fan, a humidity sensor, a first temperature sensor, a second temperature sensor and a processing unit. The casing includes a front bezel with an opening. The display panel is disposed on a first side of the opening and the transparent plate is disposed on a second side of the opening such that a space is formed between the display panel and the transparent plate. The humidity sensor is configured for sensing a humidity of the space. The first temperature sensor is configured for sensing a first temperature of the space. The second temperature sensor is configured for sensing a second temperature of the transparent plate. When the processing unit determines that the humidity, the first temperature and the second temperature meet a predetermined relationship, the processing unit increases a rotational speed of the fan.

14 Claims, 8 Drawing Sheets

(56) References Cited

U.S. PATENT DOCUMENTS

| | | | | |
|---|---|---|---|---|
| 2008/0061156 A1* | 3/2008 | Goedde | .................... | H04N 5/00 236/44 A |
| 2010/0171889 A1* | 7/2010 | Pantel | ............... | G02F 1/133308 349/1 |
| 2012/0131936 A1* | 5/2012 | Yoshida | .................... | G09F 9/35 62/176.6 |
| 2012/0182687 A1* | 7/2012 | Dighde | ............. | H04M 1/72563 361/692 |
| 2012/0306372 A1* | 12/2012 | Yang | ........................ | H05B 3/86 315/117 |
| 2015/0116507 A1* | 4/2015 | Sagerian | .................. | H04N 5/64 348/189 |

FOREIGN PATENT DOCUMENTS

| | | |
|---|---|---|
| TW | 200838408 | 9/2008 |
| TW | 200909911 | 3/2009 |
| TW | 200923557 | 6/2009 |
| TW | 201006904 | 2/2010 |
| TW | M377610 | 4/2010 |
| TW | 201510365 | 3/2015 |

\* cited by examiner

DISPLAY DEVICE

BACKGROUND OF THE INVENTION

1. Field of the Invention

The present invention relates to a display device, and more particularly, to a dewing-proof display device.

2. Description of the Prior Art

In recent years, a protective glass is usually attached in front of a display device to prevent the display panel of the display device from damage caused by physical impacts. As the usage time of the display device increases, the internal temperature of the display device increases as well and the protective glass dews due to the temperature variation. Dewing of the interior side of the protective glass has negative influences on user's sight line and visual judgment. When the protective glass dews, the user would not be able to use the display device until the dew fades away after several hours, thus causing inconvenience to the user.

SUMMARY OF THE INVENTION

One of the purposes of the present invention is to provide a dewing-proof display device to solve the aforementioned problems.

According to one embodiment of the present invention, the display device includes a casing, a display panel, a transparent plate, a fan, a humidity sensor, a first temperature sensor, a second temperature sensor and a processing unit. The casing includes a front bezel with an opening. The display panel is disposed on a first side of the opening and the transparent plate is disposed on a second side of the opening such that a space is formed between the display panel and the transparent plate. The first side is opposite to the second side. The fan is disposed in the casing. The humidity sensor is disposed in the space for sensing a humidity of the space. The first temperature sensor is disposed in the space for sensing a first temperature of the space. The second temperature sensor is disposed on the transparent plate for sensing a second temperature of the transparent plate. The processing unit is disposed in the casing and electrically connected to the fan, the humidity sensor, the first temperature sensor and the second temperature sensor. When the processing unit determines that the humidity, the first temperature and the second temperature meet a predetermined relationship, the processing unit increases a rotational speed of the fan.

In sum, according to the present invention, the humidity sensor and the first temperature sensor are disposed in the space formed between the display panel and the transparent plate. The humidity and the first temperature of the space are sensed by the humidity sensor and the first temperature sensor, respectively. The second temperature sensor is disposed on the transparent plate for sensing the second temperature of the transparent plate. When the processing unit determines that the humidity, the first temperature and the second temperature meet the predetermined relationship, which suggests that the transparent plate is about to dew, the processing unit increases the rotational speed of the fan to enhance heat dissipation and air ventilation so as to avoid dewing.

The above-mentioned and other objectives of the present invention will no doubt become obvious to those of ordinary skill in the art after reading the following detailed description of the preferred embodiment that is illustrated in the various figures and drawings.

DETAILED DESCRIPTION OF PREFERRED EMBODIMENTS

Figure 1:
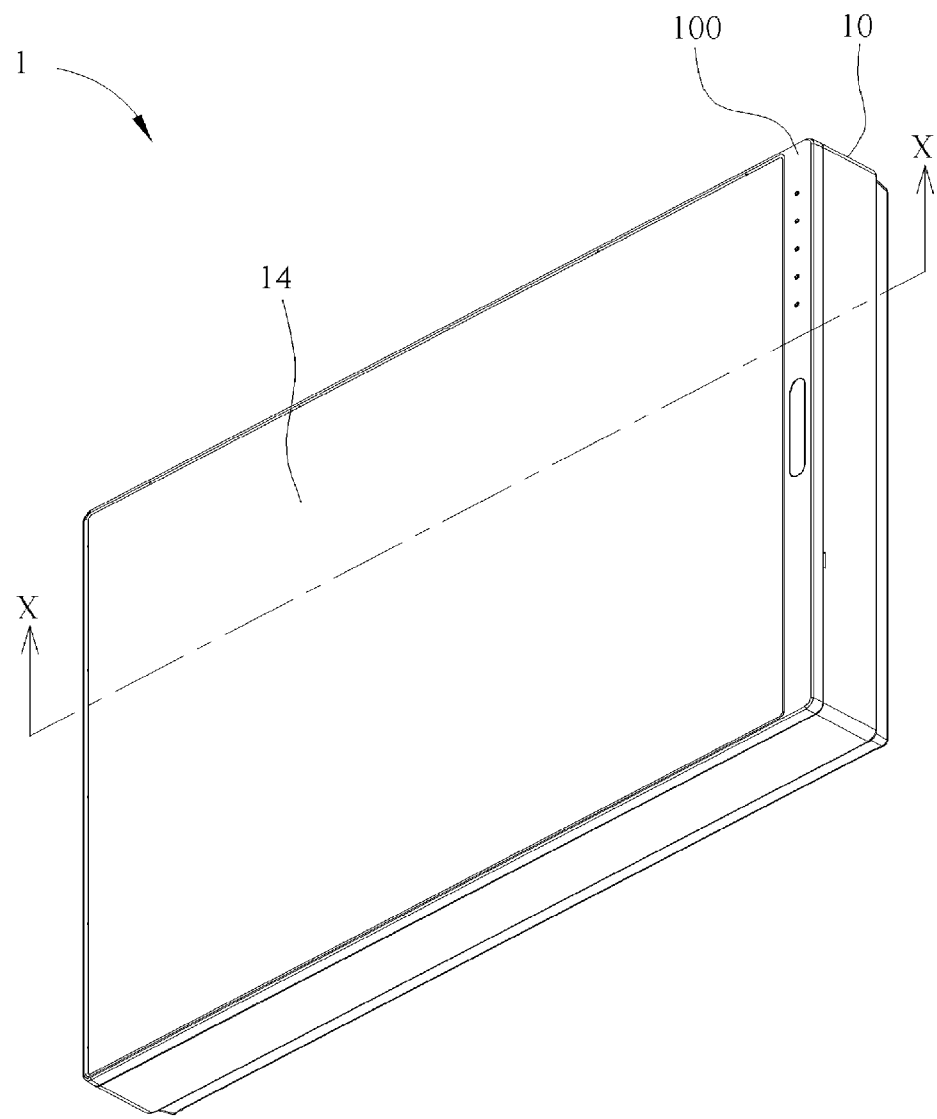
FIG. 1 is a three dimensional view of a display device according to an embodiment of the present invention.
Figure 2:
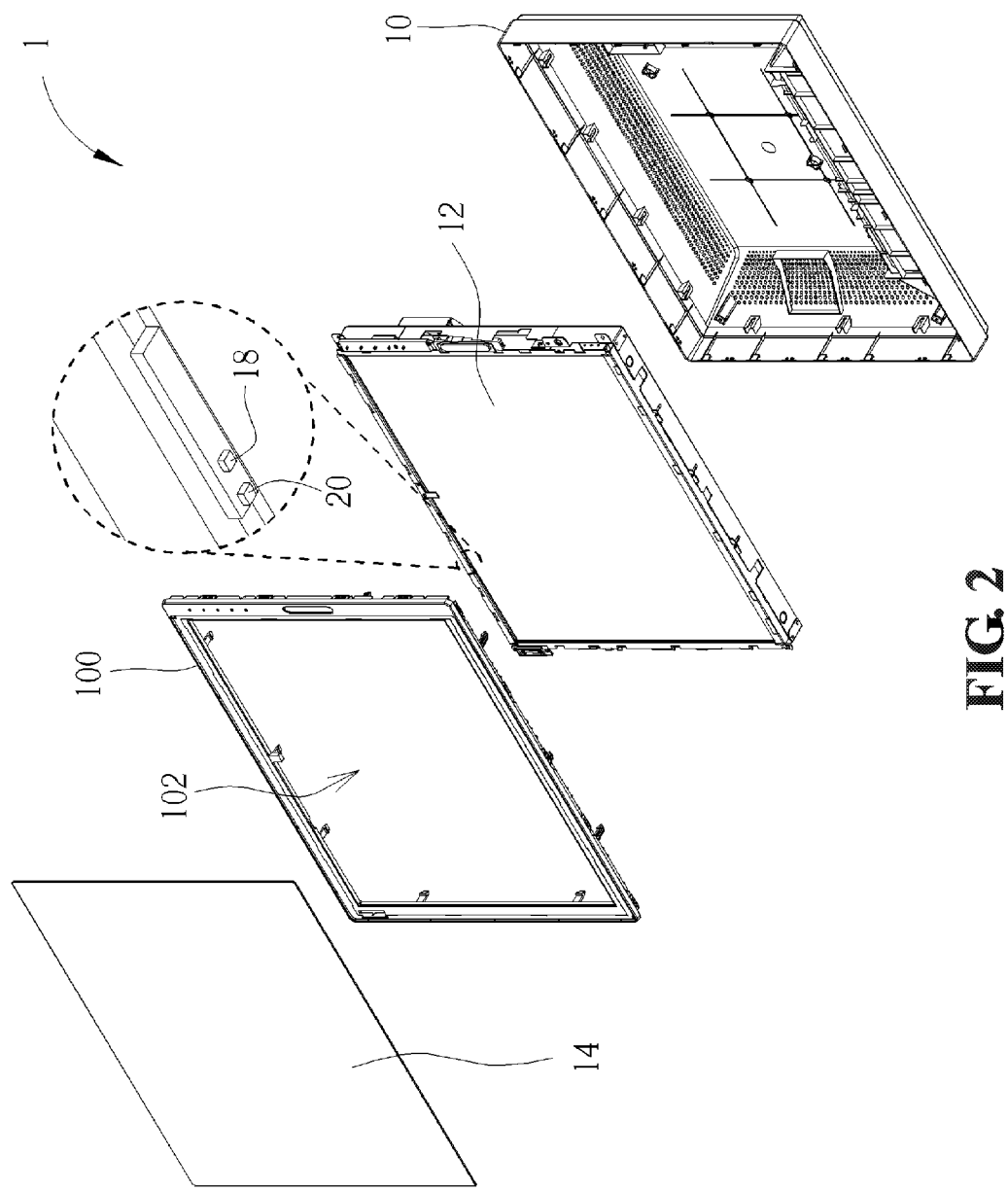
FIG. 2 is an exploded view of the display device of FIG. 1.
Figure 3:
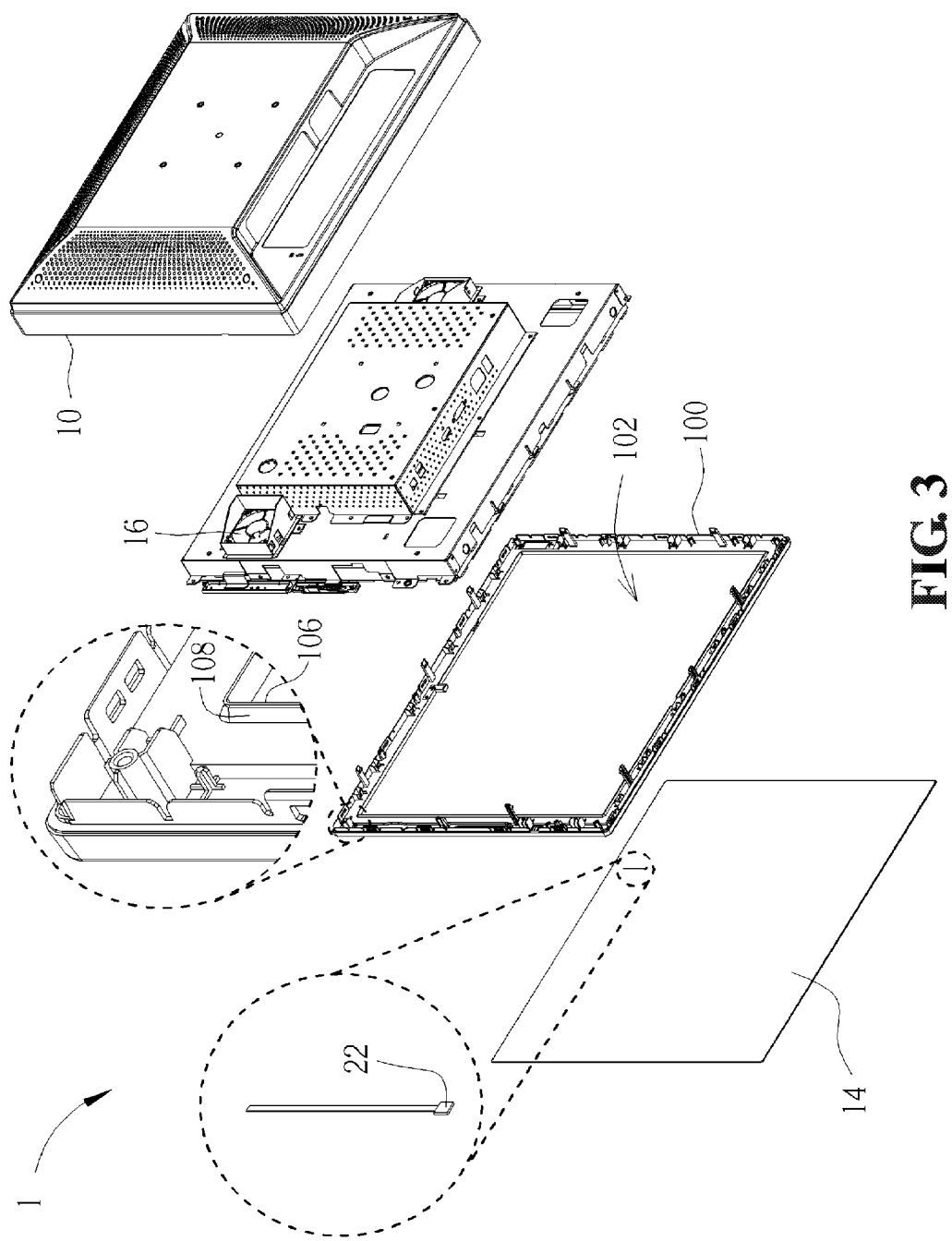
FIG. 3 is an exploded view of the display device of FIG. 1 from another viewing angle.
Figure 4:
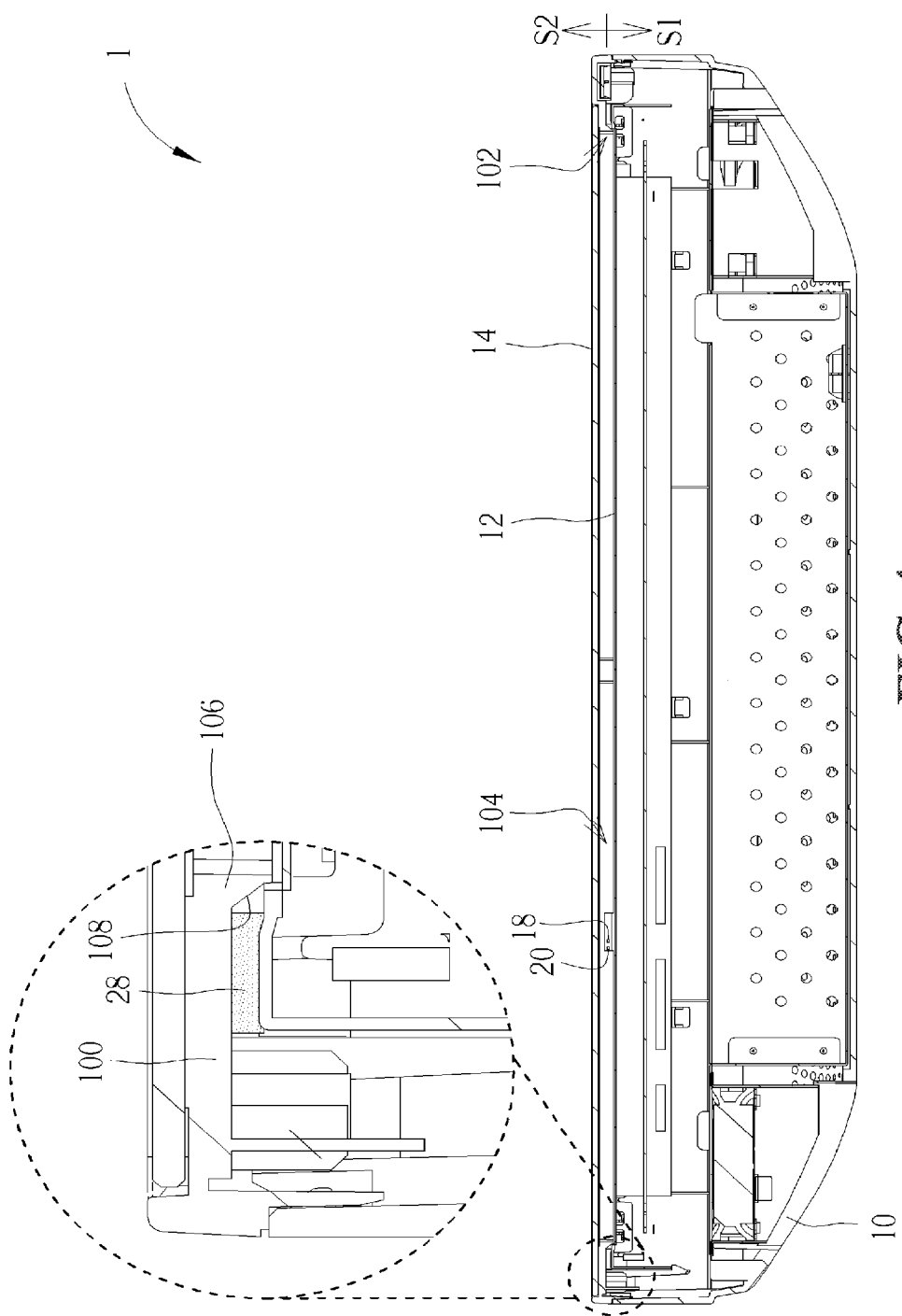
FIG. 4 is a cross-sectional view of the display device of FIG. 1 along line X-X.
Figure 5:
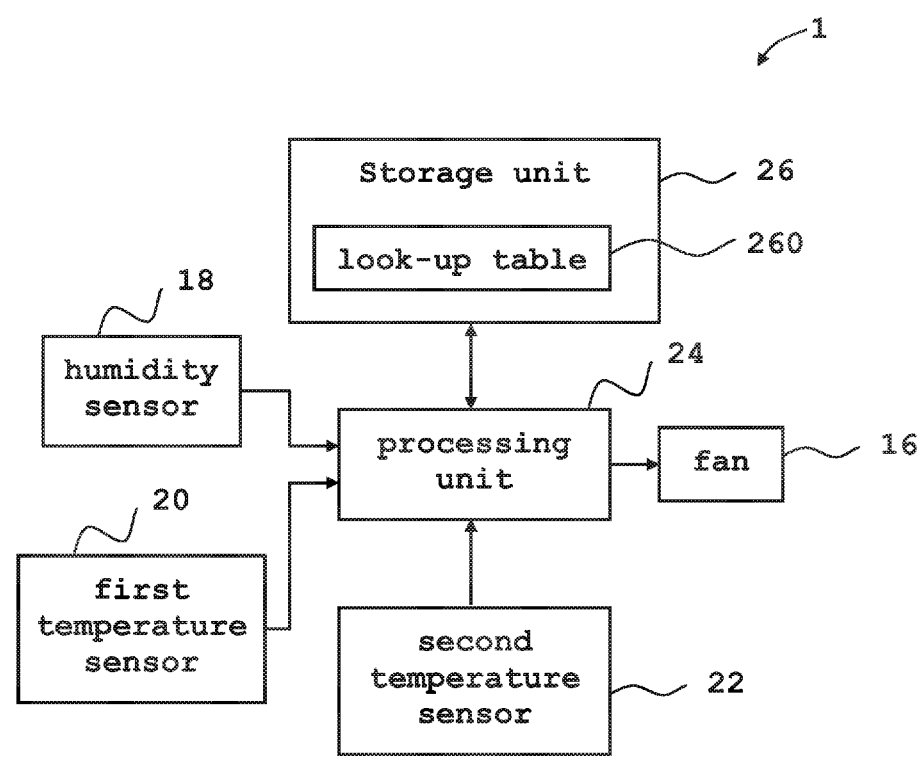
FIG. 5 is a functional block diagram of the display device of FIG. 1.

Please refer to FIG. 1 through FIG. 5. FIG. 1 is a three dimensional view of a display device 1 according to an embodiment of the present invention. FIG. 2 is an exploded view of the display device 1 of FIG. 1. FIG. 3 is an exploded view of the display device 1 of FIG. 1 from another viewing angle. FIG. 4 is a cross-sectional view of the display device 1 of FIG. 1 along line X-X. FIG. 5 is a functional block diagram of the display device 1 of FIG. 1.

As shown in FIG. 1 through FIG. 4, the display device 1 includes a casing 10, a display panel 12, a transparent plate 14, a fan 16, a humidity sensor 18, a first temperature sensor 20, a second temperature sensor 22, a processing unit 24, a storage unit 26 and a low-density foam 28. In the embodiment of the present invention, the display panel 12 may be a liquid crystal display panel or other types of display panel. The transparent plate 14 may be a glass, a touch panel or other types of transparent plate. The processing unit 25 may be a processor or a controller with data processing function. The storage unit 26 may be a memory or other data storage device.

The casing 10 includes a front bezel 100 with an opening 102. The display panel 12 is disposed on a first side S1 of the opening 102 and the transparent plate 14 is disposed on a second side S2 of the opening 102, such that a space 104 is formed between the display panel 12 and the transparent plate 14. The first side S1 is opposite to the second side S2. The fan 16 is disposed inside the casing 10. The humidity sensor 18 and the first temperature sensor 20 are both disposed in the space 104. The humidity sensor 18 senses a humidity of the space 104. The first temperature sensor 20 senses a first temperature of the space 104. The second temperature sensor 22 is disposed on the transparent plate 14 for sensing a second temperature of the transparent plate 14. The processing unit 24 and the storage unit 26 are both disposed in the casing 10. The processing unit 24 is electrically connected to the fan 16, the humidity sensor 18, the first temperature sensor 20, the second temperature sensor 22 and the storage unit 26. The low-density foam 28 is disposed between the front bezel 100 and the display panel 12.

In the embodiment of the present invention, the front bezel 100 has a wall 106 disposed around the opening 102. As shown in FIGS. 3 and 4, the wall 106 has an inclined plane 108 facing a direction away from the opening 102. A gap between the inclined plane 108 of the wall 106 and the casing 10 therefore ventilates the space 104 formed between the display panel 12 and the transparent plate 14. Besides, the low-density foam 28 prevents dusts from entering the space 104 and accelerates temperature balance of the space 104 with the environment.

In the embodiment of the present invention, the storage unit 26 stores a look-up table 260. The look-up table 260 is configured to record a predetermined relationship of the humidity, the first temperature and the second temperature sensed by the humidity sensor 18, the first temperature sensor 20 and the second temperature sensor 22, respectively. Please refer to Table 1 below. Table is an embodiment of the look-up table 260.

TABLE 1

| first predetermined temperature (° C.) | predetermined humidity | | | | | |
|---|---|---|---|---|---|---|
| | 100% | 90% | 80% | 70% | 60% | ... |
| | second predetermined temperature (° C.) | | | | | |
| 0 | 0 | −1.4 | −3 | −4.8 | −6.8 | ... |
| 2 | 2 | 0.5 | −1.1 | −2.9 | −4.9 | ... |
| 4 | 4 | 2.5 | 0.9 | −1 | −3.1 | ... |
| 6 | 6 | 4.5 | 2.8 | 0.9 | −1.2 | ... |
| 8 | 8 | 6.5 | 4.8 | 2.9 | 0.7 | ... |
| 10 | 10 | 8.4 | 6.7 | 4.8 | 2.6 | ... |
| 12 | 12 | 10.4 | 8.7 | 6.7 | 4.5 | ... |
| 14 | 14 | 12.4 | 10.6 | 8.6 | 6.4 | ... |
| 16 | 16 | 14.4 | 12.5 | 10.5 | 8.2 | ... |
| 18 | 18 | 16.3 | 14.5 | 12.4 | 10.1 | ... |
| 20 | 20 | 18.3 | 16.4 | 14.4 | 12 | ... |
| ... | ... | ... | ... | ... | ... | ... |

As shown in Table 1, the predetermined relationship includes a predetermined humidity corresponding to the humidity of the space 104, a first predetermined temperature corresponding to the first temperature of the space 104 and a second predetermined temperature corresponding to the second temperature of the transparent plate 14. In the embodiment of the present invention, the processing unit 24 determines whether the transparent plate 14 is about to dew by one of three conditions described below.

Condition 1: When the first temperature of the space 104 is substantially equal to the first predetermined temperature, the second temperature of the transparent plate 14 is substantially equal to the second predetermined temperature, and the absolute value of the difference between the humidity of the space 104 and the predetermined humidity is smaller than or substantially equal to a humidity threshold, the processing unit 24 determines that the humidity of the space 104, the first temperature of the space 104 and the second temperature of the transparent plate 14 meet the predetermined relationship. For example, assuming that the humidity threshold is 3%. When the first temperature of the space 104 is 12° C., the second temperature of the transparent plate 14 is 8.7° C., and the humidity of the space 104 is 78%, Table 1 indicates that the corresponding predetermined humidity is 80%. Since the absolute value of the difference between the humidity 78% of the space 104 and the corresponding predetermined humidity 80% is smaller than the humidity threshold, i.e. 2%<3%, the processing unit 24 determines that the humidity of the space 104, the first temperature of the space 104 and the second temperature of the transparent plate 14 meet the predetermined relationship, suggesting that the transparent plate 14 is about to dew. On the contrary, when the absolute value of the difference between the humidity of the space 104 and the corresponding predetermined humidity is greater than the humidity threshold, the processing unit 24 determines that the humidity of the space 104, the first temperature of the space 104 and the second temperature of the transparent plate 14 do not meet the predetermined relationship, suggesting that the transparent plate 14 is not in a condition to dew.

Condition 2: When the humidity of the space 104 is substantially equal to the predetermined humidity, the second temperature of the transparent plate 14 is substantially equal to the second predetermined temperature, and the absolute value of the difference between the first temperature of the space 104 and the first predetermined temperature is smaller than or substantially equal to a first temperature threshold, the processing unit 24 determines that the humidity of the space 104, the first temperature of the space 104 and the second temperature of the transparent plate 14 meet the predetermined relationship. For example, assuming that the first temperature threshold is 3° C. When the humidity of the space 104 is 70%, the second temperature of the transparent plate 14 is 12.4° C., and the first temperature of the space 104 is 19° C., Table 1 indicates that the corresponding first predetermined temperature is 18° C. Since the absolute value of the difference between the first temperature 19° C. of the space 104 and the first predetermined temperature 18° C. is smaller than the first temperature threshold, i.e. 1° C.<3° C., the processing unit 24 determines that the humidity of the space 104, the first temperature of the space 104 and the second temperature of the transparent plate 14 meet the predetermined relationship, suggesting that the transparent plate 14 is about to dew. On the contrary, when the absolute value of the difference between the first temperature of the space 104 and the first predetermined temperature is greater than the first temperature threshold, the processing unit 24 determines that the humidity of the space 104, the first temperature of the space 104 and the second temperature of the transparent plate 14 do not meet the predetermined relationship, suggesting that the transparent plate 14 is not in a condition to dew.

Condition 3: When the humidity of the space 104 is substantially equal to the predetermined humidity, the first temperature of the space 104 is substantially equal to the first predetermined temperature, and the absolute value of the difference between the second temperature of the transparent plate 14 and the second predetermined temperature is smaller than or substantially equal to a second temperature threshold, the processing unit 24 determines that the humidity of the space 104, the first temperature of the space 104 and the second temperature of the transparent plate 14 meet the predetermined relationship. For example, assuming that the second temperature threshold is 2° C. When the humidity of the space 104 is 60%, the first temperature of the space 104 is 20° C., and the second temperature of the transparent plate is 14° C., Table 1 indicates that the corresponding second predetermined temperature is 12° C. Since the absolute value of the difference between the second temperature 14° C. of the transparent plate 14 and the second predetermined temperature 12° C. is equal to the second temperature threshold, i.e. 2° C.=2° C., the processing unit 24 determines that the humidity of the space 104, the first temperature of the space 104 and the second temperature of the transparent plate 14 meet the predetermined relationship, suggesting that the transparent plate 14 is about to dew. On the contrary, when the absolute value of the difference between the second temperature of the transparent plate 14 and the second predetermined temperature is greater than the second temperature threshold, the processing unit 24 determines that the humidity of the space 104, the first temperature of the space 104 and the second temperature of the transparent plate 14 do not meet the predetermined relationship, suggesting that the transparent plate 14 is not in a condition to dew.

In other words, the look-up table 260 records the predetermined relationship of the corresponding humidity, the corresponding first temperature and the corresponding second temperature for determining whether the transparent plate 14 is about to dew or not.

When the processing unit 24 determines that the humidity of the space 104, the first temperature of the space 104 and the second temperature of the transparent plate 14 meet the predetermined relationship, the transparent plate 14 being about to dew is suggested. At such moment, the processing unit 24 would increase the rotational speed of the fan 16 to enhance heat dissipation and air ventilation so as to avoid dewing. In the embodiment of the present invention, increasing the rotational speed of the fan 16 means that the processing unit 24 drives the fan 16 to operate from a still state or drives the fan 16 to operate at a higher speed from a lower speed, depending upon actual applications.

After the rotational speed of the fan 16 has been increased for a period of time and the processing unit 24 determines that the humidity of the space 104, the first temperature of the space 104 and the second temperature of the transparent plate 14 no longer meet the predetermined relationship, the transparent plate 14 being free from dewing is suggested. Under such condition, the processing unit 24 would slow down the rotational speed of the fan 16. In the embodiment of the present invention, reducing the rotational speed of the fan 16 means that the processing unit 24 stops operation of the fan 16 or drives the fan 16 to operate at a lower speed from a higher speed, depending upon actual applications.

When the processing unit 24 determines that the transparent plate 14 is about dew and subsequently increases the rotational speed of the fan 16 in response to Condition 1, the processing unit 24 would further increase the rotational speed of the fan 16 to enhance heat dissipation and air ventilation if the absolute value of the difference between the humidity of the space 104 and the predetermined humidity is becoming smaller. That is, in the embodiment of the present invention, the smaller the absolute value of the difference between the humidity and the predetermined humidity is, the higher the processing unit maintains the rotational speed of the fan 16 at. When the processing unit 24 determines that the transparent plate 14 is about to dew and subsequently increases the rotational speed of the fan 16 in response to Condition 2, the processing unit 24 would further increase the rotational speed of the fan 16 to enhance heat dissipation and air ventilation if the absolute value of the difference between the first temperature of the space 104 and the first predetermined temperature is becoming smaller. That is, in the embodiment of the present invention, the smaller the absolute value of the difference between the first temperature of the space 104 and the first predetermined temperature is, the higher the processing unit maintains the rotational speed of the fan 16 at. When the processing unit 24 determines that the transparent plate 14 is about to dew and subsequently increases the rotational speed of the fan 16 in response to Condition 3, the processing unit 24 would further increase the rotational speed of the fan 16 to enhance heat dissipation and air ventilation if the absolute value of the difference between the second temperature of the transparent plate 14 and the second predetermined temperature is becoming smaller. That is, in the embodiment of the present invention, the smaller the absolute value of the difference between the second temperature of the transparent plate 14 and the second predetermined temperature is, the higher the processing unit maintains the rotational speed of the fan 16 at. Please note that, however, in other embodiments of the present invention, the processing unit may increase the rotational speed of the fan 16 by a constant value, depending upon actual applications.

Figure 6:
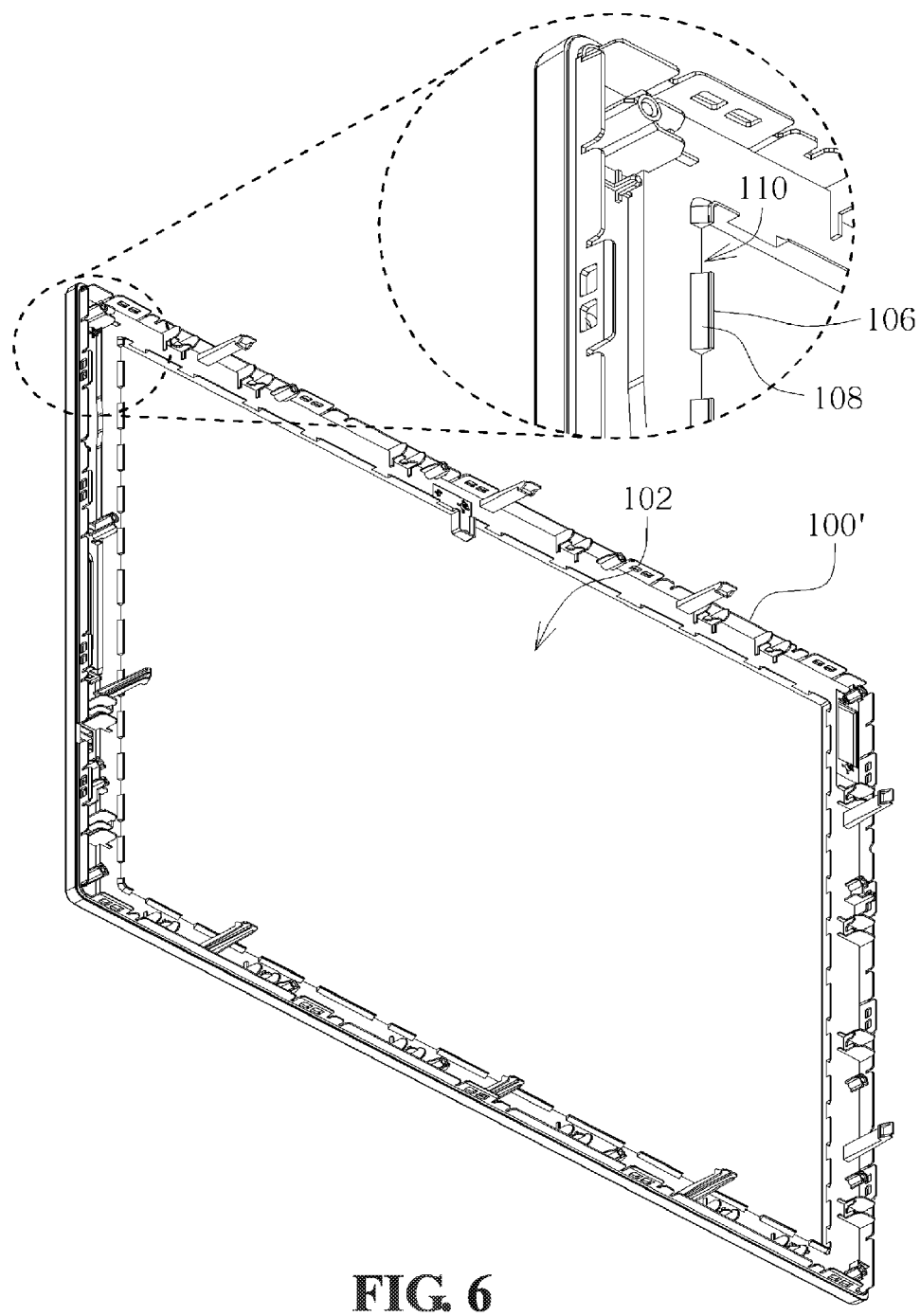
FIG. 6 is a three dimensional view of a front bezel according to another embodiment of the present invention.

Please refer to FIG. 6. FIG. 6 is a three dimensional view of a front bezel 100' according to another embodiment of the present invention. The front bezel 100' differs from the front bezel 100 in that the wall 106 disposed around the opening 102 has at least a breach 110 as shown in FIG. 6. When the front bezel 100 of FIG. 1 through FIG. 4 is replaced with the front bezel 100', the breach 110 is configured to ventilate the space 104.

Figure 7:
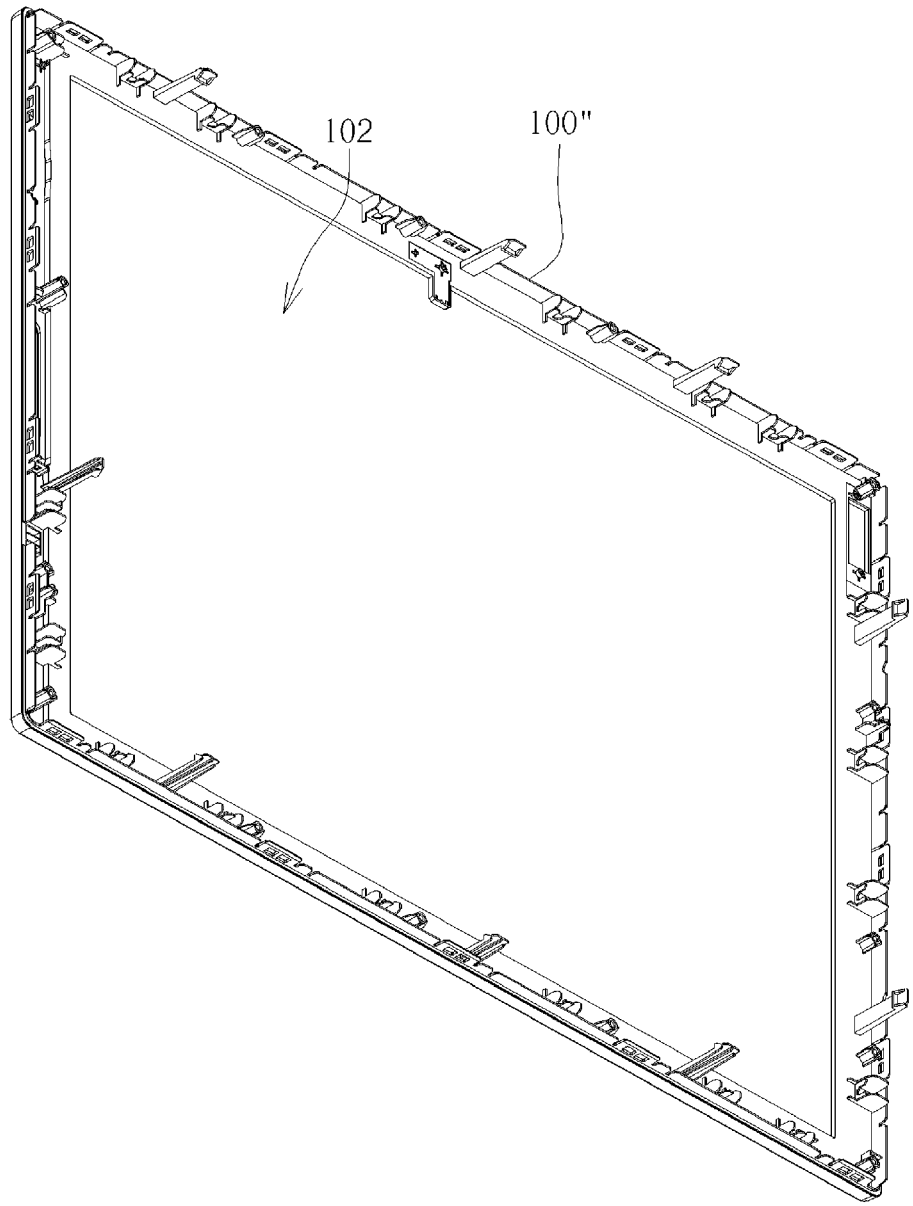
FIG. 7 is a three dimensional view of a front bezel according to another embodiment of the present invention.
Figure 8:
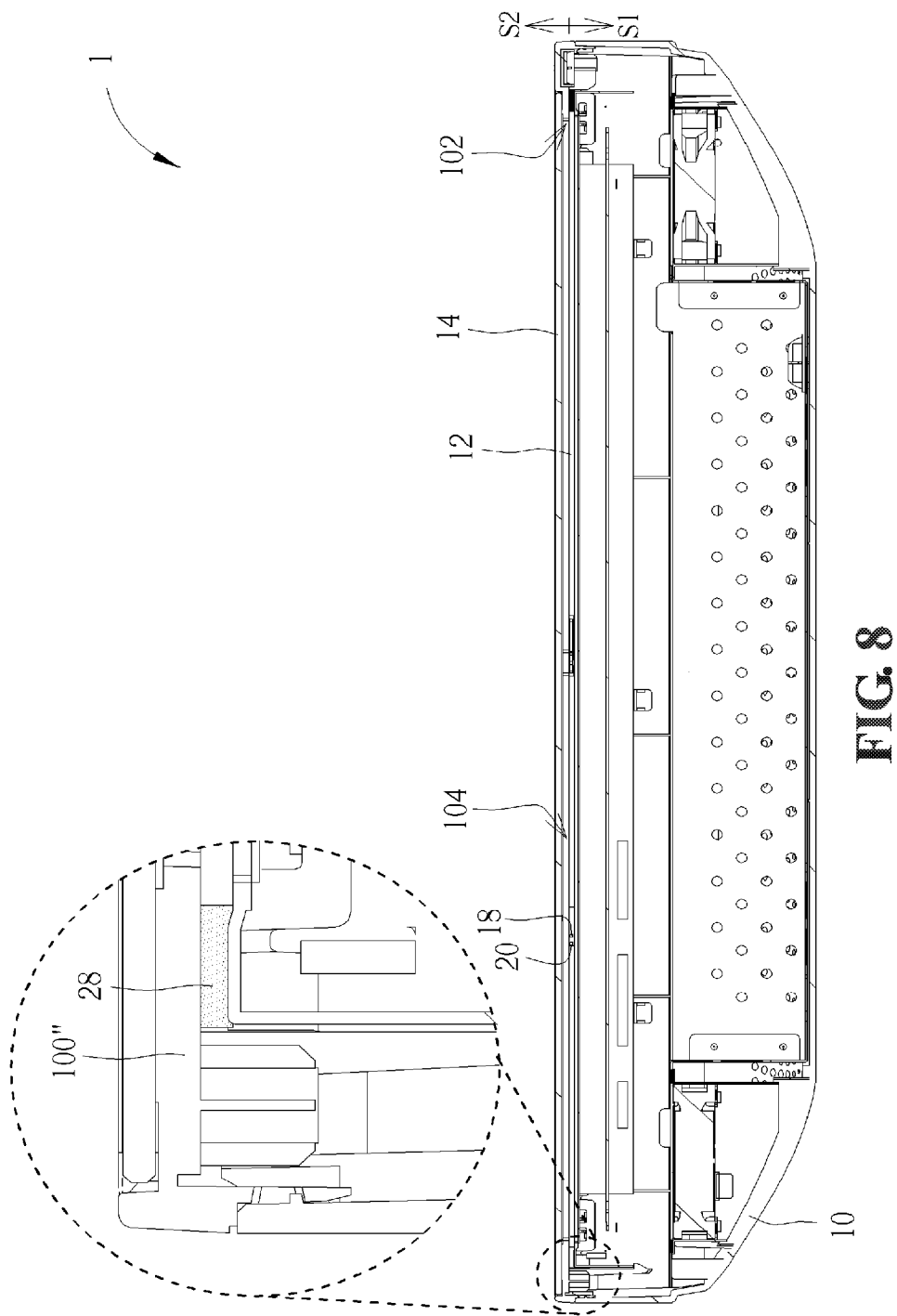
FIG. 8 is a cross-sectional view of the display device of FIG. 4 with the front bezel of FIG. 7.

Please refer to FIGS. 7 and 8. FIG. 7 is a three dimensional view of a front bezel 100" according to another embodiment of the present invention. FIG. 8 is identical to FIG. 4 except that the front bezel 100 of FIG. 4 is replaced with the front bezel 100" of FIG. 7. The front bezel 100" differs from the front bezel 100 in that the front bezel 100" does not have a wall disposed around the opening 102, and the casing 10 allows an external air flow to pass through the display device 1 to ventilate the space 104, as shown in FIGS. 7 and 8.

In sum, according to the present invention, the humidity sensor and the first temperature sensor are disposed in the space formed between the display panel and the transparent plate. The humidity and the first temperature of the space are sensed by the humidity sensor and the first temperature sensor, respectively. The second temperature sensor is disposed on the transparent plate for sensing the second temperature of the transparent plate. When the processing unit determines that the humidity, the first temperature and the second temperature meet the predetermined relationship, which suggests that the transparent plate is about to dew, the processing unit increases the rotational speed of the fan to enhance heat dissipation and air ventilation so as to avoid dewing.

Those skilled in the art will readily observe that numerous modifications and alterations of the device and method may be made while retaining the teachings of the invention.

What is claimed is:

1. A display device comprising:
   a casing comprising a front bezel with an opening;
   a display panel disposed on a first side of the opening;
   a transparent plate disposed on a second side of the opening such that a space is formed between the display panel and the transparent plate, and the first side being opposite to the second side;
   a fan disposed inside the casing;
   a humidity sensor disposed in the space for sensing a humidity of the space;
   a first temperature sensor disposed in the space for sensing a first temperature of the space;
   a second temperature sensor disposed directly on the transparent plate for sensing a second temperature of the transparent plate; and
   a processing unit disposed in the casing and electrically connected to the fan, the humidity sensor, the first temperature sensor and the second temperature sensor,
   wherein when the processing unit determines that the humidity, the first temperature and the second temperature meet a predetermined relationship according to a look-up table, the processing unit increases a rotational speed of the fan.

2. The display device of claim 1, wherein when the processing unit determines that the humidity, the first temperature and the second temperature do not meet the predetermined relationship after the rotational speed of the fan is increased for a period of time, the processing unit decreases the rotational speed of the fan.

3. The display device of claim 1, wherein the predetermined relationship comprises a predetermined humidity corresponding to the humidity, a first predetermined temperature corresponding to the first temperature and a second predetermined temperature corresponding to the second temperature, when the first temperature is substantially equal to the first predetermined temperature, the second temperature is substantially equal to the second predetermined temperature, and an absolute value of a difference between the humidity and the predetermined humidity is smaller than or substantially equal to a humidity threshold, the processing unit determines that the humidity, the first temperature and the second temperature meet the predetermined relationship.

4. The display device of claim 3, wherein the smaller the absolute value of the difference between the humidity and the predetermined humidity is, the higher the processing unit maintains the rotational speed of the fan at.

5. The display device of claim 1, wherein the predetermined relationship comprises a predetermined humidity corresponding to the humidity, a first predetermined temperature corresponding to the first temperature and a second predetermined temperature corresponding to the second temperature, when the humidity is substantially equal to the predetermined humidity, the second temperature is substantially equal to the second predetermined temperature, and an absolute value of a difference between the first temperature and the first predetermined temperature is smaller than or substantially equal to a first temperature threshold, the processing unit determines that the humidity, the first temperature and the second temperature meet the predetermined relationship.

6. The display device of claim 5, wherein the processing unit maintains the fan at a first rotational speed when the difference between the first temperature and the first predetermined temperature is a first absolute value, and the processing unit maintains the fan at a second rotational speed when the difference between the first temperature and the first predetermined temperature is a second absolute value, when the second absolute value is smaller than the first absolute value, the second rotational speed is higher than the first rotational speed, and the first rotational speed and the second rotational speed are higher than zero.

7. The display device of claim 1, wherein the predetermined relationship comprises a predetermined humidity corresponding to the humidity, a first predetermined temperature corresponding to the first temperature and a second predetermined temperature corresponding to the second temperature, when the humidity is substantially equal to the predetermined humidity, the first temperature is substantially equal to the first predetermined temperature, and an absolute value of a difference between the second temperature and the second predetermined temperature is smaller than or substantially equal to a second temperature threshold, the processing unit determines that the humidity, the first temperature and the second temperature meet the predetermined relationship.

8. The display device of claim 7, wherein the processing unit maintains the fan at a first rotational speed when the difference between the second temperature and the second predetermined temperature is a first absolute value, and the processing unit maintains the fan at a second rotational speed when the difference between the second temperature and the second predetermined temperature is a second absolute value, when the second absolute value is smaller than the first absolute value, the second rotational speed is higher than the first rotational speed, and the first rotational speed and the second rotational speed are higher than zero.

9. The display device of claim 1, wherein the processing unit increases the rotational speed of the fan by a constant value.

10. The display device of claim 1, further comprising a storage unit electrically connected to the processing unit, the storage unit storing the look-up table configured to record the predetermined relationship.

11. The display device of claim 1, further comprising a low-density foam disposed between the front bezel and the display panel.

12. The display device of claim 1, wherein the front bezel has a wall disposed around the opening, the wall has an inclined plane facing a direction away from the opening, and a gap between the inclined plane and the casing ventilates the space.

13. The display device of claim 1, wherein the front bezel has a wall disposed around the opening, the wall has a breach, and the breach ventilates the space.

14. The display device of claim 1, wherein the front bezel does not have a wall disposed around the opening, and the casing allows an external air flow to pass through the display device to ventilate the space.

* * * * *